United States Patent [19]

Jaentsch

[11] Patent Number: 4,717,688
[45] Date of Patent: Jan. 5, 1988

[54] LIQUID PHASE EPITAXY METHOD

[75] Inventor: Ottomar Jaentsch, Ottobrunn, Fed. Rep. of Germany

[73] Assignee: Siemens Aktiengesellschaft, Berlin and Munich, Fed. Rep. of Germany

[21] Appl. No.: 7,486

[22] Filed: Jan. 28, 1987

[30] Foreign Application Priority Data

Apr. 16, 1986 [DE] Fed. Rep. of Germany ....... 3612828

[51] Int. Cl.$^4$ .......................................... H01L 21/368
[52] U.S. Cl. .................................. 437/120; 437/114; 437/915
[58] Field of Search ................. 148/171, 172; 29/571, 29/576 E

[56] References Cited

U.S. PATENT DOCUMENTS 4,585,493 4/1986 Anthony .............................. 148/171
4,654,958 4/1987 Baerg et al. ........................... 29/571

FOREIGN PATENT DOCUMENTS 0117339 9/1984 European Pat. Off. .
2445146 4/1976 Fed. Rep. of Germany .
96520 6/1982 Japan .................................. 156/604

OTHER PUBLICATIONS

Kass et al., "Silicon Multilayers Grown by Liquid Phase Epitaxy", Essderc, 1985, 9 pages.
Kass et al., "Liquid Phase Epitaxy of Silicon: Potentialities and Prospects", *Physica*, vol. 129b, Amsterdam, Holland, (1985), pp. 161-165.
Hansen et al., "*Constitution of Binary Alloys*", (1958), McGraw-Hill, N.Y., pp. 51 and 232.

*Primary Examiner*—George T. Ozaki
*Attorney, Agent, or Firm*—Hill, Van Santen, Steadman & Simpson

[57] ABSTRACT

A liquid phase epitaxy method for the manufacture of silicon layers containing semiconductor structures involving the epitaxial deposition of silicon using a melt of a metal as the solvent, the metal forming silicon saturated solutions below 900° C., and not producing any doping in the layers corresponding to a concentration greater than $10^{17}$ doping atoms/cm$^3$. A gold melt is preferred because the melting point of the gold-silicon eutectic is about 370° C. The invention provides for implementing the liquid phase epitaxy at very low temperatures and, thus, producing single crystal silicon layers on substrates provided with insulation layers, and required for the manufacture of three-dimensional integrated circuits in microelectronics.

7 Claims, 4 Drawing Figures

LIQUID PHASE EPITAXY METHOD

BACKGROUND OF THE INVENTION

1. Field of the Invention

The present invention is in the field of liquid phase epitaxy method for the manufacture of three-dimensional semiconductor structures on silicon substrates which are provided with insulation layers, utilizing a metal melt as a solvent for epitaxially depositing uniformly doped silicon layers and manufacturing semiconductor structures in these layers.

2. Description of the Prior Art

In microelectronics, it is necessary for three-dimensional integration of component structures to apply a plurality of silicon layers on top of one another in an insulated fashion. Active and passive components such as, for example, thin film transistors, bi-polar transistors, and capacitors are then generated in these layers with the method steps which are standard in microelectronics.

The typical means for generating silicon layers on silicon dioxide layers has been deposition from the vapor phase. These layers are initially polycrystalline. These polycrystalline layers can be melted with lasers, graphite heaters, or intense radiation sources, and can then be recrystallized into single crystal layers proceeding from a window in the oxide layer. The single substrate in the window thereby acts as a seed and determines the orientation of the single cystal layer by the process of lateral seeding. A disadvantage of this method is that the silicon substrate is necessarily heated in the recrystallization range and the components which are already manufactured can suffer thermal damage. This type of method is disclosed, for example, in European Patent Application No. 0 117 339.

In DE-AS No. 24 45 146 there is disclosed the deposition of thin, doped single crystal layers by means of liquid phase epitaxy. The substrate to be coated is brought into contact by centrifugal force with a metal melt containing the layer material. The metals gallium, bismuth, indium, antimony, and tin are employed as solvents for the silicon.

In an article by Kass et al. appearing at the ESSDERC, 1985, it is shown that layers laterally grown over $SiO_2$ can be produced with uniform doping. As described in European Patent Application No. 0117339, such silicon layers manufactured by liquid phase epitaxy can be employed for the manufacture of three-dimensional component structures. Gallium is preferably employed for the liquid phase epitaxy as a solvent for the silicon in this patent application, as well as in the periodical "Physica", vol. 129B (1985), pages 161–165. This combination produces a concentration of doping which is greater than $10^{18}/cm^3$ and is therefore not suitable as a basic doping for the three-dimensionally constructed layers of an integrated semiconductor circuit.

SUMMARY OF THE PRESENT INVENTION

The present invention seeks to provide a suitable metal as a solvent for a liquid phase epitaxy system which permits the process to occur at relatively low temperatures and by means of which silicon layers can be generated having component structures with optimum parameters for three-dimensional integration.

In the method of the type previously described, this objective is achieved by using metal solvents distinguished by the following properties:

(a) a silicon saturated solution of the metal is molten at temperatures below 900° C., (b) the metal does not produce any doping in the silicon layers which amounts to a concentration as high as $10^{17}$ dopant atoms/$cm^3$, and (c) the metal is not a silicide-forming agent.

The preferred embodiment of the present invention involves a gold melt for dissolving the silicon. The melting point of the gold-silicon eutectic is at about 370° C. (see "Constitution of Binary Alloys" by Hansen (1958), page 232). A liquid phase epitaxy is therefore at low temperatures. In accordance with a preferred embodiment of the present invention, the proportion of silicon in the silicon-gold melt is adjusted to more than 31 atomic percent but less than 49 atomic percent, and preferably to a range between 32 and 38 atomic percent.

In the crystallization of the silicon from the gold-silicon melt, a certain residue of gold remains in the silicon. The solubility of gold in silicon is extremely low at the low temperatures. For example, at 600° C., the solubility is below $10^{13}/cm^3$, and is below $10^{12}/cm^3$ at 500° C. Moreover, gold produces deep inpurity levels and not flat impurity levels at the band edges which are completely ionized at room temperature. If the slight gold concentrations in the silicon are undesirable, they can be eliminated in a known way be getter processes.

Silver can also be employed as a solvent, preferably using a silicon-silver melt having a silicon concentration between 15.4 and 16.0 atomic percent. The eutectic melting point is higher than that of the gold-silicon eutectic, as noted by the aforementioned book by Hansen, page 51.

It is important for the purposes of the present invention that the solvent does not produce any doping above $10^{17}/cm^3$, with a preferred value being a doping below $10^{14}$ atoms/$cm^3$. It is also important that the metal form no silicides and that the solution of the metal saturated with silicon is molten at temperatures which lie below the normal manufacturing temperatures of integrated circuits, i.e., 900° C.

BRIEF DESCRIPTION OF THE DRAWINGS

Further details of the invention, particularly regarding the implementation of the liquid phase epitaxy are set forth in greater detail below.

DESCRIPTION OF THE PREFERRED EMBODIMENTS

Figure 1:
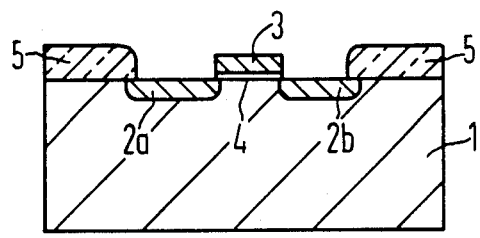
FIGS. 1 through 4 show enlarged cross sections illustrating the various stages of method steps essential to the invention for the manufacture of a simple, three-dimensional structure in the form of a CMOS inverter up to the point of metallization. The apparatus for implementation of the method may be derived from the report by Kass et al. in the periodical "Physica", vol. 129B (1985), pages 161–165, the disclosure of which is hereby incorporated by reference.

As shown in FIG. 1, there is first provided a p-doped silicon substrate 1 after which n-doped source/drain zones 2a and 2b are provided for the n-channel transistor. The gate electrodes 3 is then structured, being composed, for example, of n-doped polysilicon for the n-channel transistors. The gate electrode is separated from the silicon substrate 1 by means of a gate oxide layer 4. The field oxide regions separating the individual MOS inverters (n-channel and p-channel transistors) are referred to at reference numeral 5 and are generated, for example, in accordance with the well-known LOCOS method before the transistor structures 2, 3, and 4 are generated on the silicon substrate.

Figure 2:
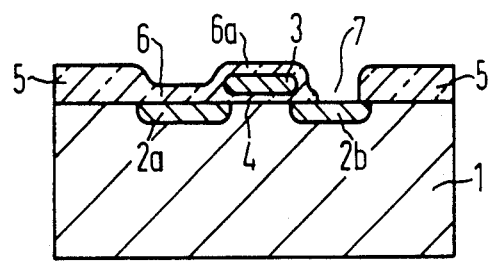

In FIG. 2 there is shown a silicon dioxide layer 6 which has been applied to the elements 1, 2, 3, 4, 5 which contain the n-channel type transistor, the silicon dioxide layer 6 including a gate oxide 6a in the region of the gate surface 3 for the p-channel transistor to be generated subsequently by liquid phase epitaxy. FIG. 2 shows the arrangement after the application of the oxide layer 6 and after a contact hole 7 to the diffused region 2b has been opened up. As may be seen from this figure, a high degree of planarization of the arrangement occurs due to the application of the oxide layer 6 since the layer 6 completely fills out the trenches over the n-channel transistor.

Figure 3:
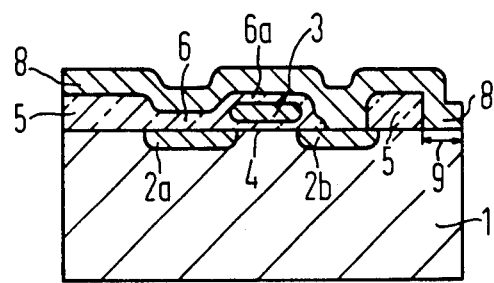

In FIG. 3 there is shown a step of carrying out a liquid phase epitaxy with a silicon-gold melt. The silicon-gold composition is above the eutectic concentration which has a temperature of about 370° C. The ratio of silicon-to-gold above the eutectic is about 35-to-65 atomic percent. A single crystalline silicon layer 8 is produced utilzing the apparatus previously referred to in the periodical "Physica", whereby a diffused zone 2b is produced. There may also be a region indicated by the double arrow 9 which is opened outside the n-chanel transistor region by means of an etching in the field oxide region 5 to serve as seed regions on the substrate.

Figure 4:
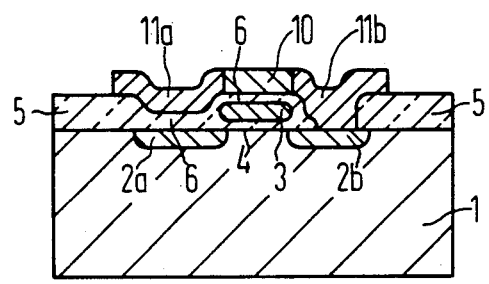

The active zones of the p-channel type, as shown in FIG. 4, are now successively generated in the single crystal silicon layer which has been applied surface-wide by the liquid phase epitaxy using gold as a solvent. An n-doped region 10 serving as a gate is first produced by implantation with n-doping ion, such as arsenic, and after this region has been masked, the p-doped zones 11a and 11b of the p-channel transistor are generated by boron ion implantation.

The contacting and metallization leads such as the ground connection at 2a, a contactor for the collector supply voltage $V_{cc}$ at 11a, an input electrode at 3, and an output electrode at 11b, are then produced in the known way after structuring of the p-channel transistor 10, 11a, 11b.

It should be evident that various modifications can be made to the described embodiments without departing from the scope of the present invention.

I claim as my invention:

1. In a liquid phase epitaxy method for the manufacture of three-dimensional semiconductor structures on a silicon substrate in which a molten metal solvent is employed for the manufacture of uniformly doped silicon layers, the improvement which comprises:
    employing as the solvent a metal having the following characteristics:
    (1) a solution of said metal saturated with silicon is molten at temperatures below 900° C.,
    (2) the metal does not produce doping in the silicon which corresponds to a concentration of more than $10^{17}$ doping atoms/cm$^3$, and
    (3) the metal is not a silicide-forming agent.

2. A method according to claim 1, wherein said metal is gold.

3. A method according to claim 2, wherein the proportion of silicon and solution in said gold is greater than 31 atomic percent but less than 49 atomic percent.

4. A method according to claim 3, wherein the proportion of silicon is in the range of 32 to 28 atomic percent.

5. A method according to claim 1, wherein the basic doping of said uniformly doped silicon layers it at a concentration below $10^{14}$ doping atoms/cm$^3$.

6. A method according to claim 1, wherein said metal is silver.

7. A method according to claim 6, wherein the proportion of silicon in the silicon-silver melt is in the range from 15.4 to 16.0 atomic percent.

* * * * *